May 6, 1952 F. A. DE GROOT 2,595,931

SUPERHETERODYNE RECEIVER WITH AUTOMATIC FREQUENCY CONTROL

Filed April 18, 1946

INVENTOR.
Folkert Albert De Groot
BY
[signature]
ATTORNEY

Patented May 6, 1952

2,595,931

UNITED STATES PATENT OFFICE 2,595,931

SUPERHETERODYNE RECEIVER WITH AUTOMATIC FREQUENCY CONTROL

Folkert Albert de Groot, Eindhoven, Netherlands, assignor, by mesne assignments, to Hartford National Bank and Trust Company, Hartford, Conn., as trustee Application April 18, 1946, Serial No. 662,963
In the Netherlands August 16, 1941

Section 1, Public Law 690, August 8, 1946
Patent expires August 16, 1961

5 Claims. (Cl. 250—20)

Figure 1:
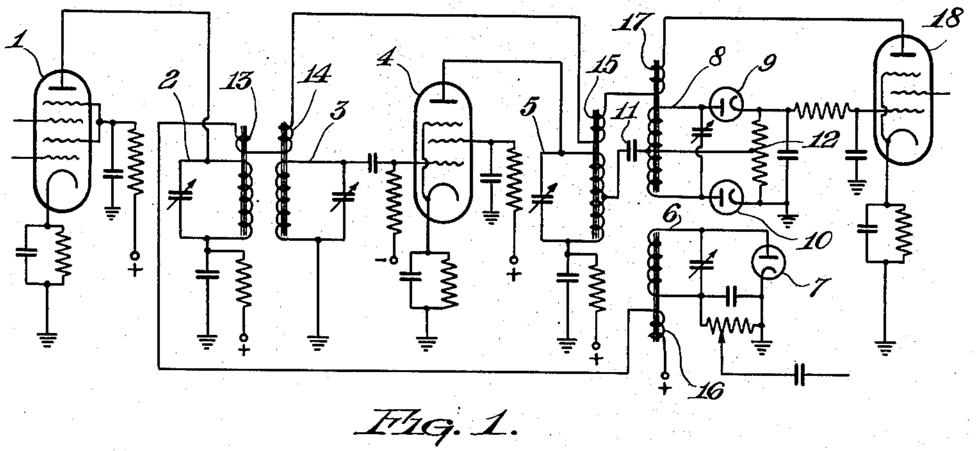

The invention relates to a superheterodyne receiver which is provided with automatic frequency control in order to bring the frequency of the intermediate-frequency carrier wave of the received signal in accordance with the tuning frequency of at least one intermediate-frequency circuit.

With the known receivers of this kind the automatic frequency control is brought about by influencing the tuning of the local oscillator with the aid of a control voltage which depends on the frequency of the intermediate-frequency carrier wave. In this case there arises, however, the difficulty that the sensitiveness of the control greatly depends on the frequency to which the receiver is tuned. Inconveniences are experienced from this dependence on frequency, more particularly if the receiver can be tuned to more than one wave-range, in which event it is often necessary to change-over the circuit elements by means of which the control tube for the automatic frequency control is coupled with the oscillator circuit, upon the passage to another wave-range, due to which the circuit-arrangement becomes very complicated.

It is known to avoid the said difficulty by utilizing a double frequency transformation wherein the received signal is first converted, with the aid of a tunable local oscillator, into a first intermediate frequency and then, with the aid of a second local oscillator of constant frequency, into a second intermediate frequency. The automatic frequency control may be effected in this case by acting upon the tuning of the second oscillator, which has a constant frequency. This solution involves, however, the drawback that the double frequency transformation frequently gives rise to the production of whistling sounds.

According to the invention, the said drawback is avoided owing to the fact that the frequency control is effected by influencing the tuning of at least one intermediate-frequency circuit.

The application of the invention offers particular advantages in the case wherein the intermediate-frequency portion of the receiver comprises a sharp filter for the selection of the carrier wave and wherein the automatic frequency control serves to keep the intermediate-frequency carrier wave within the frequency range selected by the filter. Examples of such receivers will be mentioned hereinafter.

Upon the reception of signals which are highly subject to fading, there frequently occurs a serious distortion due to the fact that the carrier wave of the received signal is weakened to a higher extent than the side bands (selective fading) so that there occurs an apparent overmodulation. It is known to eliminate this drawback by accentuating the carrier wave in the receiver with respect to the sidebands, which may be effected with the aid of a filter which has for a narrow band of frequencies on either side of the carrier wave frequency a considerably smaller damping than for the sideband frequencies. In this case it is also possible to separate the carrier wave with the aid of a filter which only transmits a narrow band of frequencies and to add it after amplification, either before or in the detector, again to the signal. Another known method consists in that the signal passes through a filter which consists of one or more highly selective circuits and wherein the sideband frequencies are weakened to a high extent whereupon the distortion thus produced is eliminated again by a suitable frequency characteristic of the low-frequency portion of the receiver.

In the reception of signals with which only the carrier wave and one sideband are received, it is desirable, in order to obtain a distortionless detection, that the amplitude of the carrier wave of the signal supplied to the detector should be large with respect to the amplitudes of the sideband frequencies. This may likewise be achieved in a known manner by accentuating the carrier wave or by separating the latter and by adding it after amplification again to the signal.

Furthermore, there are known receivers wherein aperiodic disturbances are suppressed by rendering the intermediate-frequency portion inoperative during the presence of a disturbance. In order to avoid that in this case a new disturbance is produced due to the interruption of the transmission, the carrier wave is suppressed before the point of interruption and after the point of interruption either before or in the detector it is added again to the signal. For the suppression of the carrier wave, there is utilized in this case a filter which blocks a narrow band of frequencies on either side of the intermediate-frequency carrier wave.

In the above-mentioned and similar cases the intermediate-frequency portion of the receiver comprises a sharp filter which serves to select the carrier wave; by "selection" is meant both the accentuation of the carrier wave with respect to the side-band frequencies and the separation or suppression of the carrier wave.

If due to influences of temperature or to a variation of the mains voltage the frequency of the local oscillations slightly varies, the frequency of the intermediate-frequency carrier wave may vary so much that the carrier wave comes to lie outside the frequency range which is selected, i. e. accentuated, separated or suppressed, by the filter. In order to avoid this, use is made in the known receivers of an automatic frequency control by which the intermediate-frequency carrier wave is kept within the frequency range selected by the filter, in which event, however, the automatic frequency control has hitherto always been effected by influencing the tuning of the local oscillator.

According to a further feature of the invention, the automatic frequency control is effected in the above-mentioned case by influencing the tuning of the filter and, whereas for the purpose of a satisfactory frequency control it would in general be necessary to influence the tuning of all the intermediate frequency circuits, it is here sufficient to influence exclusively the tuning of the filter.

It is true that a variation of the frequency of the local oscillations results in this case in a displacement of the intermediate-frequency carrier wave with respect to the tuning frequency of the intermediate-frequency circuits located outside the filter but no drawbacks are experienced therefrom since here slight variations of the oscillator frequency are concerned (of the order of 1 kc. at the most).

The network which generates the control voltage for the automatic frequency control, must be responsive to very slight frequency variations. In order to obtain this result the circuit-arrangement is preferably such that the filter which serves to select the carrier wave forms at the same time part of the said network.

In the known receivers, which comprise a sharp filter for the selection of the carrier wave, use is frequently made for this purpose of a crystal filter. Since the tuning frequency of a crystal filter can only be controlled with difficulty and within very narrow limits, use is preferably made in the case under consideration of a filter which comprises one or more oscillatory circuits the damping of which is reduced by back-coupling.

The invention will be explained more fully with reference to the accompanying drawing which represents, by way of example, two embodiments thereof.

Fig. 1 represents the intermediate-frequency portion of a receiver of usual construction to which the invention has been applied. A mixing hexode 1 wherein the received high-frequency oscillations are supplied in the usual manner to the inner control grid and the local oscillations to the outer control grid is coupled with an intermediate-frequency amplifying tube 4 through the intermediary of a band filter which consists of mutually coupled resonant circuits 2 and 3 which are tuned to the intermediate frequency. Through the intermediary of a second band filter, which consists of mutually coupled resonant circuits 5 and 6 which are tuned to the intermediate frequency, the intermediate-frequency amplifying tube is coupled with a diode detector 7 whose low-frequency output voltage is supplied to the low-frequency amplifier (not shown).

With the first circuit 5 of the second band filter is coupled furthermore a circuit 8 which is likewise tuned to the intermediate frequency and which has connected to it two push-pull diodes 9 and 10. One point of the circuit 5 is connected to the middle of the circuit 8 through the intermediary of a condenser 11. The circuits 5 and 8 and the diodes 9 and 10 form together a known network for the generation of a control voltage for automatic frequency control, which control voltage occurs across the output resistance 12 of the diodes 9 and 10.

The inductance coils of the circuits 2, 3, 5, 6 and 8 comprise cores of high-frequency iron on which are provided magnetising coils 13, 14, 15, 16 and 17. By altering the direct current which flows through these magnetising coils it is possible to modify the tuning of the circuits within certain limits.

The control voltage set up across the resistance 12 is supplied to the control grid of a pentode 18 whose anode current is led through the magnetising coils 13, 14, 15, 16 and 17. If the intermediate frequency generated in the mixing tube 1 differs from the frequency to which the circuits 2, 3, 5, 6 and 8 are tuned, there occurs across the resistance 12 a control voltage whose polarity depends on the sense of the detuning and which modifies the anode current of the tube 18 with the result that the tuning of the circuits is modified in the desired sense until the tuning frequency of the circuits corresponds or at least approximately corresponds to the generated intermediate frequency.

Figure 2:
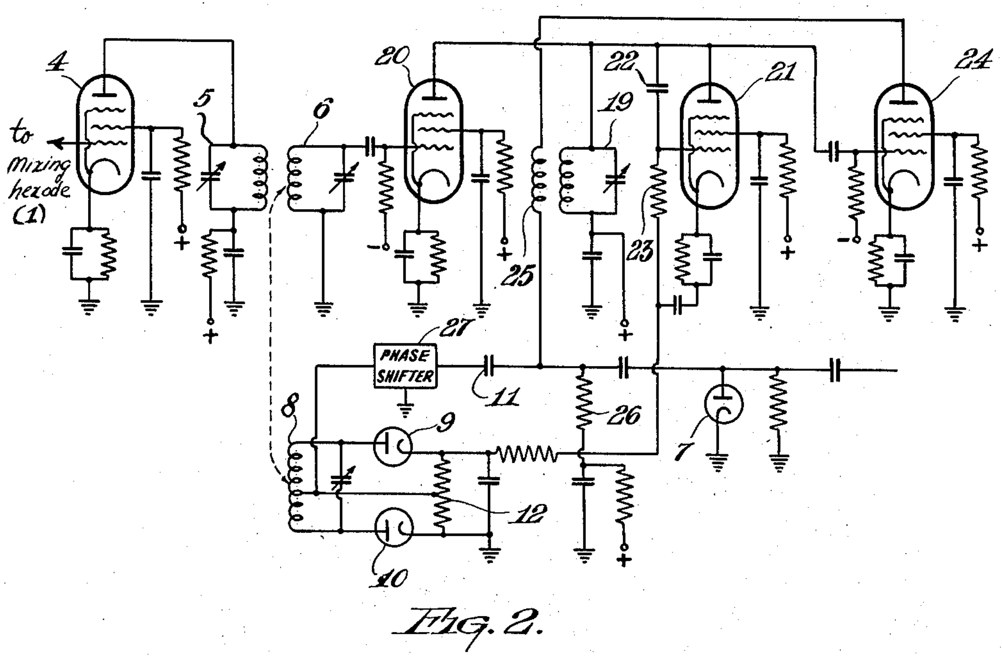

Fig. 2 represents a portion of a receiver whose intermediate-frequency portion comprises a sharp filter for the selection of the carrier wave and wherein the frequency control is effected exclusively by influencing the tuning of this filter.

The filter in question consists of a resonant circuit 19 which is tuned to the intermediate frequency and whose damping is reduced by back-coupling, said circuit being incorporated in the anode circuit of an amplifying tube 20 which is connected to the second circuit 6 of the second intermediate-frequency band filter.

The circuit 19 has connected to it the anode-cathode impedance of a control tube 21 for the automatic frequency control. With the aid of a phase-shifting network which consists of a condenser 22 and a resistance 23, there is supplied to the control grid of the control tube an alternating voltage which is out of phase by about 90° relatively to the anode alternating voltage so that the tube 21 behaves in known manner as a reactance whose value may be modified by varying the mutual conductance of the tube. The control grid of the tube 21 has furthermore supplied to it, through the intermediary of the resistance 23, the control voltage set up across the resistance 12.

The voltage produced across the circuit 19 is supplied to the control grid of an amplifying tube 24 which serves, on the one hand, to afford the desired back-coupling and, on the other hand, to prevent the circuit 19 from being excessively damped by the diodes 7, 9 and 10. The anode circuit of the tube 24 comprises a feed-back coil 25 as well as an output impedance 26 which is shown in the drawing as an ohmic resistance. The voltage set up across the output impedance 26 is supplied, on the one hand, to the detector 7 and, on the other hand, through the intermediary of the condenser 11 and a phase-correcting network 27 to the middle of the circuit 8. The network 27 serves to obtain a correct phase displacement between the voltages supplied to the circuit 8. This might also be obtained by constructing the impedance 26 in such manner that this impedance affords the desired phase displacement. In contradistinction to the circuit-arrangement according to Fig. 1, the circuit 8 is coupled with the second circuit 6 of the second intermediate-frequency band filter.

The circuits 6, 8 and 19 form, jointly with the tubes 20 and 24, the coupling elements 11 and 26 and the diodes 9 and 10, a known network for the generation of a control voltage for automatic frequency control.

Owing to the presence of the highly selective circuit 19, the sideband frequencies of the intermediate frequency signal are greatly weakened with respect to the carrier wave with the result that the danger that in the case of selective fading an apparent overmodulation of the signal may occur, which would be attended with great distortion, is eliminated. The distortion due to the weakening of the side band frequency is suppressed by a proper choice of the frequency characteristic of the low-frequency amplifier.

For the desired operation it is necessary that the tuning frequency of the circuit 19 should always correspond exactly to the frequency of the intermediate-frequency carrier wave, this accord being ensured by the automatic frequency control, for, if there occurs a divergence between the said frequencies, a control voltage of suitable polarity is set up across the resistance 12, which voltage modifies the reactance formed by the tube 21 to such an extent that the tuning frequency of the circuit 19 is brought again into accordance with the carrier wave frequency.

Since the circuit 19 forms part of the network for generating the control voltage, the control is very sensitive to slight frequency variations.

I claim:

1. An automatically frequency controlled superheterodyne receiver, comprising means to convert a received carrier wave to an intermediate frequency carrier wave, an intermediate frequency amplifier channel having a resonant circuit tunable to said intermediate frequency carrier wave, a reactance tube circuit coupled across said resonant circuit, means comprising a frequency-responsive network including said resonant circuit to derive from said resonant circuit a control voltage having amplitude values proportional to the deviation of the frequency of said intermediate frequency carrier wave from the resonant frequency of said intermediate frequency channel and having polarity variations dependent on the deviation of the frequency of said intermediate frequency carrier wave from the resonant frequency of said intermediate frequency channel, means responsive to said control voltage to vary the reactance superimposed by said reactance tube circuit on said resonant circuit to tune the same automatically to the frequency of said intermediate frequency carrier wave, an electron discharge tube having an input circuit and an output circuit, means to couple the input circuit of said tube across said resonant circuit, and means to couple the output circuit of said tube in regenerative feedback relationship to said resonant circuit to suppress damping thereof.

2. An automatically frequency controlled superheterodyne receiver, comprising means to convert a received carrier wave to an intermediate frequency carrier wave, an intermediate frequency amplifier channel having a resonant circuit tunable to said intermediate frequency carrier wave, a reactance tube circuit coupled across said resonant circuit, means comprising a frequency-responsive network including said resonant circuit to derive from said resonant circuit a control voltage having amplitude values proportional to the deviation of the frequency of said intermediate frequency carrier wave from the resonant frequency of said intermediate frequency channel and having polarity variations dependent on the deviation of the frequency of said intermediate frequency carrier wave from the resonant frequency of said intermediate frequency channel, means responsive to said control voltage to vary the reactance superimposed by said reactance tube circuit on said resonant circuit to tune the same automatically to the frequency of said intermediate frequency carrier wave, an electron discharge amplifier tube having an input circuit and an output circuit, means to couple the input circuit of said tube across said resonant circuit, means to couple the output circuit of said tube in regenerative feedback relationship to said resonant circuit to suppress damping thereof, and means coupled to the output circuit of said electron discharge amplifier tube to derive a direct output potential.

3. An automatically frequency controlled superheterodyne receiver, comprising means to convert a received carrier wave to an intermediate frequency carrier wave, an intermediate frequency amplifier channel having a first amplifier stage and a second amplifier stage coupled in cascade, said first amplifier stage having an input circuit comprising a resonant circuit and said second amplifier stage having an input circuit comprising a resonant filter tunable to said intermediate frequency carrier wave and an output circuit regeneratively coupled to said resonant filter to suppress damping thereof, a reactance tube circuit coupled across said resonant filter, a frequency-responsive network coupled to the input circuit of said first amplifier stage and including said resonant filter to produce a control voltage having amplitude values proportional to the deviation of the frequency of said intermediate frequency carrier wave from the resonant frequency of said intermediate frequency channel and having polarity variations dependent on the deviation of the frequency of said intermediate frequency carrier wave from the resonant frequency of said intermediate frequency channel, means to apply said control voltage to said reactance tube circuit to vary the reactance superimposed by said circuit on said resonant filter to tune the same automatically to the frequency of said intermediate frequency carrier wave, and a detector stage coupled to the output circuit of said second amplifier stage.

4. An automatically frequency controlled superheterodyne receiver, comprising means to convert a received carrier wave to an intermediate frequency carrier wave, an intermediate frequency amplifier channel having a resonant circuit tunable to said intermediate frequency carrier wave, means comprising a frequency responsive network including said resonant circuit to derive from said resonant circuit a control voltage having amplitude values proportional to the deviation of said intermediate frequency carrier wave from the resonant frequency of said intermediate frequency channel and having polarity variations dependent on the deviation of said intermediate frequency carrier wave from the resonant frequency of said intermediate frequency channel, means responsive to said control voltage to vary the frequency of said resonant circuit to tune the same automatically to the frequency of said intermediate frequency carrier wave, and means coupled to the output of said amplifier channel to derive a regenerative feedback voltage therefrom and to apply said regenerative feedback voltage to said resonant circuit to suppress damping thereof.

5. An automatically frequency controlled superheterodyne receiver, comprising conversion means to convert a received carrier wave to an intermediate frequency carrier wave, an intermediate frequency amplifier channel comprising a first resonant circuit tuned to said intermediate frequency carrier wave and coupled to said conversion means and a second resonant circuit tunable to said intermediate frequency carrier wave and coupled to said first resonant circuit, means comprising a frequency responsive network including said second resonant circuit and coupled to said first resonant circuit to produce a control voltage having amplitude values proportional to the deviation of said intermediate frequency carrier wave from the resonant frequency of said intermediate frequency channel and having polarity variations dependent on the deviation of said intermediate frequency carrier wave from the resonant frequency of said intermediate frequency channel, means responsive to said control voltage to vary the frequency of said second resonant circuit to tune the same automatically to the frequency of said intermediate frequency carrier wave, and means coupled to the output of said amplifier channel to derive a regenerative feedback voltage therefrom and to apply said regenerative feedback voltage to said second resonant circuit to suppress damping thereof.

FOLKERT ALBERT DE GROOT.

REFERENCES CITED

The following references are of record in the file of this patent:

UNITED STATES PATENTS

| Number | Name | Date |
|---|---|---|
| 2,133,849 | Delbond | Oct. 18, 1938 |
| 2,138,042 | Robinson | Nov. 29, 1938 |
| 2,193,843 | Robinson | Mar. 19, 1940 |
| 2,268,672 | Plebanski | Jan. 6, 1942 |
| 2,287,925 | White | June 30, 1942 |